US012621985B2

(12) United States Patent (10) Patent No.: US 12,621,985 B2

Chuang (45) Date of Patent: May 5, 2026

(54) SEMICONDUCTOR STRUCTURE AND METHOD OF MANUFACTURING THE SAME

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 455 days.

(21) Appl. No.: 18/488,627

(22) Filed: Oct. 17, 2023

(65) Prior Publication Data

US 2025/0126779 A1 Apr. 17, 2025

(51) Int. Cl.
*H10B 12/00* (2023.01)

(52) U.S. Cl.
CPC .......... *H10B 12/488* (2023.02); *H10B 12/09* (2023.02); *H10B 12/50* (2023.02)

(58) Field of Classification Search
CPC ....... H10B 12/488; H10B 12/50; H10B 12/09
See application file for complete search history.

(56) References Cited

U.S. PATENT DOCUMENTS

| | | | |
|---|---|---|---|
| 11,937,419 B2 * | 3/2024 | Zhao | H10B 12/033 |
| 2018/0108608 A1 * | 4/2018 | Lee | H10B 12/315 |
| 2024/0074154 A1 * | 2/2024 | Lee | H10B 12/315 |

FOREIGN PATENT DOCUMENTS

TW 202308047 A 2/2023

* cited by examiner

*Primary Examiner* — Dale E Page
*Assistant Examiner* — Wilner Jean Baptiste
(74) *Attorney, Agent, or Firm* — CKC & Partners Co., LLC

(57) ABSTRACT

Embodiments of this disclosure provide a method of manufacturing a semiconductor structure, and the method includes the following steps. A substrate with a first barrier layer in an array area and a second barrier layer in the peripheral area is provided. The substrate is etched toward to form recesses in the peripheral area to make a bottom surface of each of the recesses lower than a bottom surface of the second barrier layer. Gate structures are formed in the recesses, respectively. Moreover, a semiconductor structure is also disclosed this disclosure.

20 Claims, 15 Drawing Sheets

SEMICONDUCTOR STRUCTURE AND METHOD OF MANUFACTURING THE SAME

BACKGROUND

Field of Invention

The present disclosure relates to a semiconductor structure and a method of manufacturing the same. More particularly, the present disclosure relates to a semiconductor structure with recessed gate structures in a peripheral area and a method of manufacturing the same.

Description of Related Art

As electronic devices become lighter and thinner, semiconductor devices, such as dynamic random access memory (DRAM) become more highly integrated. Further, the performance of the DRAM is improved via shortening the pitch between the semiconductor structures in the DRAM. Due to shrinking the size of the semiconductor structure, in addition to increasing the difficulty of the manufacturing process, the components in the semiconductor structures are also prone to leakage resulting from too close distances.

As a result, in the semiconductor manufacturing process, how to reduce the leakage to improve the process yield of the semiconductor structure has become an important issue.

SUMMARY

Embodiments of this disclosure provide a method of manufacturing a semiconductor structure, and the method includes the following steps. A substrate is provided. Moreover, a surface of the substrate is defined with an array area and a peripheral area, the substrate comprises a first barrier layer in the array area and a second barrier layer in the peripheral area. The substrate is etched toward to form recesses in the peripheral area to make a bottom surface of each of the recesses lower than a bottom surface of the second barrier layer. A gate dielectric layer is deposited on an inner surface of each of the recesses. A first gate conductive layer is deposited on the gate dielectric layer. A second gate conductive layer is deposited on the first gate conductive layer. A cap insulating layer is deposited on the gate second conductive layer to form gate structures.

In some embodiments, the step of forming the recesses to in the peripheral area includes the following steps. A cap layer is formed on the substrate. A pad oxide layer is formed to a second thickness on the cap layer. A mask layer is formed on the pad oxide layer to expose first portions of the pad oxide layer and cover second portions of the pad oxide layer. A photolithography process is performed. The second portions of the pad oxide layer, and portions of the cap layer and the second barrier layer covered by the second portions of the pad oxide layer are removed to form first openings. The substrate in the peripheral area is etched to a first depth at a same position of each of the first openings to form the recesses.

In some embodiments, the step of forming the recesses to in the peripheral area includes the following steps. The first portions of the pad oxide layer are removed after performing the photolithography process. A blocking layer is formed on the cap layer to a third thickness to completely cover the second portions of the pad oxide layer.

In some embodiments, the third thickness is greater than the second thickness.

In some embodiments, the step of forming the recesses to in the peripheral area includes the following steps. The blocking layer is removed to form second openings at a same position of the first openings after forming the first openings. Also, each of the second openings has a first height. The substrate in the peripheral area is etched to a first depth at a same position of each of the second openings to form the recesses.

In some embodiments, the method also includes that a light doped drain region on opposite sides of each of the recesses is formed in the substrate by doped through a self-aligned implantation based on positions of the recesses.

In some embodiments, the method also includes that contact plugs area formed between the gate structures in the second dielectric layer in the peripheral area to contact the light doped drain region.

In some embodiments, the step for forming the contact plugs in peripheral area includes the following steps. The cap layer and the second barrier layer are removed to expose an upper portion of each of the gate structures and portions of the substrate in the peripheral area after forming the gate structures. The second dielectric layer is deposited on the substrate in the peripheral area to completely cover the gate structures. Contact openings are formed between the gate structures in the second dielectric layer by passing through the second dielectric layer until the light doped drain region. The contact plugs are formed in the contact openings, respectively.

In some embodiments, an interface between the substrate in the peripheral area and the second dielectric layer is higher than a bottom surface of each of the contact openings.

In some embodiments, a bottom surface of each of the plurality of gate structures is lower than an interface between the substrate and the dielectric layer in the peripheral area.

Embodiments of this disclosure also provide a semiconductor structure. The semiconductor structure includes a substrate, word line structures, a first dielectric layer, a second dielectric layer and gate structures. The substrate is defined with an array area and a peripheral area. The substrate in the array area comprises active areas and insulation areas between the active areas, and a source/drain region is disposed in each of the active areas and between the insulation areas. The word line structures are disposed in the active areas and the insulation areas. The first dielectric layer is disposed on the word line structures in the array area. The second dielectric layer is disposed on and the substrate in the peripheral area. The gate structures includes a bottom portion disposed in the substrate in the peripheral area and an upper portion disposed in the second dielectric layer in the peripheral area. Further, each of the gate structures includes a first gate conductive layer, a second gate conductive layer disposed on the first gate conductive layer, a cap insulating layer disposed on the second gate conductive layer and a gate dielectric layer disposed surrounding the first gate conductive layer, the second gate conductive layer and the cap insulating layer. As well, a bottom surface of each of the gate structures is curved or tapered.

In some embodiments, a top surface of the first gate conductive layer is concave.

In some embodiments, a bottom surface of the second gate conductive layer is curved or tapered.

In some embodiments, the semiconductor structure also includes a first contact plug. The first contact plug is disposed between the word line structures in the first dielectric layer. Moreover, the first contact plug contacts the source/drain region.

In some embodiments, a first interface between the first barrier layer and the source/drain region is higher that a first contact interface between the first contact plug and the source/drain region.

In some embodiments, the semiconductor structure also includes a light doped drain region. The light doped drain region is disposed on opposite sides of each of the gate structures in the substrate.

In some embodiments, a portion of an outer surface of the upper portion of each of the plurality of gate structures contacts each of the light doped drain regions.

In some embodiments, an outer surface of the upper portion of each of the plurality of gate structures contacts each of the light doped drain regions.

In some embodiments, the semiconductor structure also includes a second contact plug. The second contact plug is disposed between the gate structures in the second dielectric layer. Also, the second contact plug contacts the light doped drain region.

In some embodiments, a second contact surface of the second contact plug is higher than a bottom surface of each of the gate structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. The disclosure can be more fully understood by reading the following detailed description of the embodiment, with reference made to the accompanying drawings as follows.

DETAILED DESCRIPTION

Figure 1:
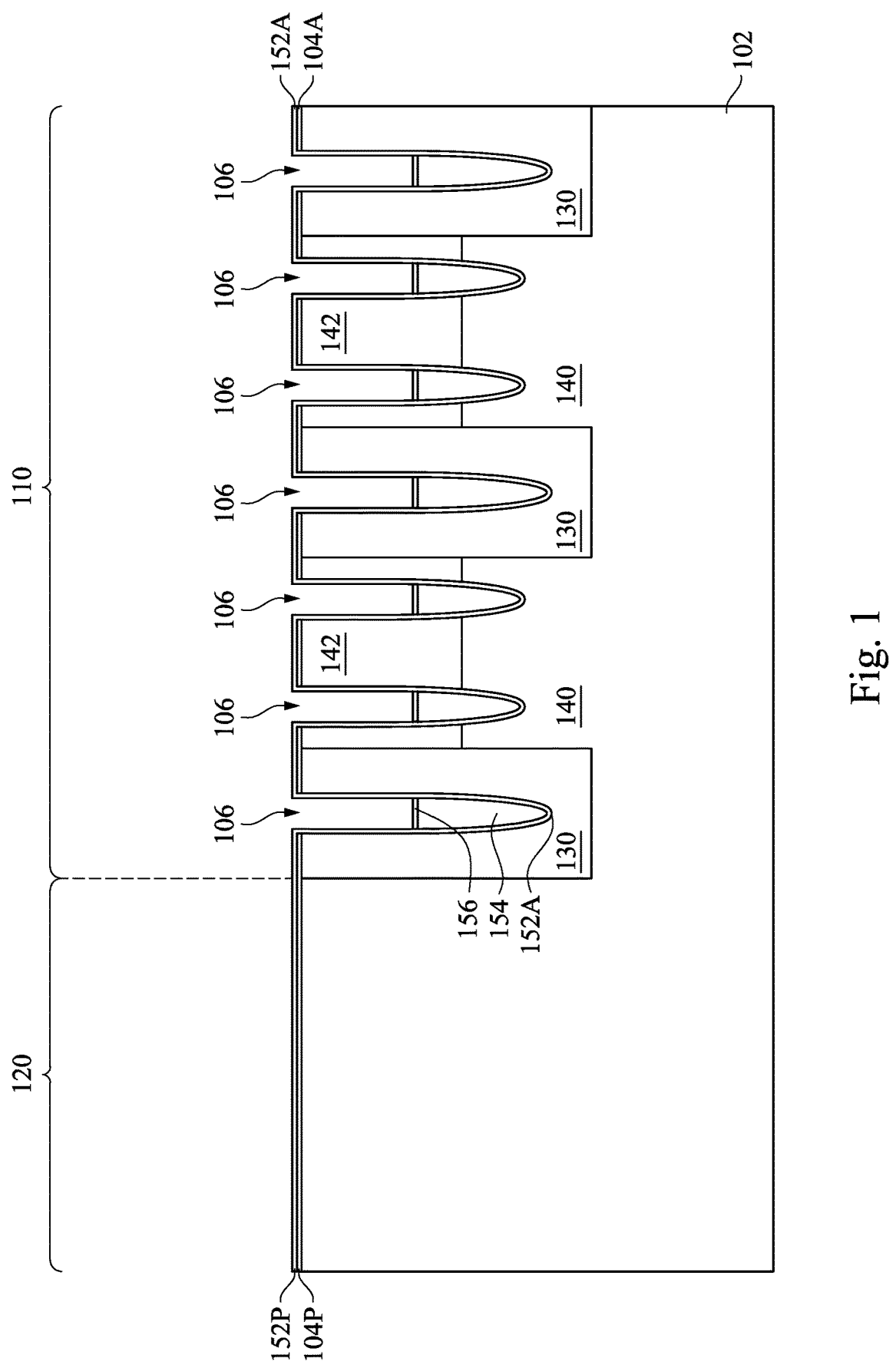
FIGS. 1 to 15 are cross-sectional views of different stages of a method of manufacturing a semiconductor structure according some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "on," "over," "under," "between" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The words "comprise", "include", "have", "contain" and the like used in the present disclosure are open terms, meaning including but not limited to.

As the size of semiconductor devices becomes smaller and smaller, the channel length of the semiconductor devices is also shorten. Also, the short channel length will induce the leakage issue because the short channel length of the semiconductor devices. Therefore, embodiments of the present disclosure provide a solution of the leakage problem caused by shrinking semiconductor devices by manufacturing a recessed gate structure in the peripheral area of DRAM.

It should be noted that when the following figures, such as FIGS. 1 to 15, are illustrated and described as a series of operations or steps, the description order of these operations or steps should not be limited. For example, some operations or steps may be undertaken in a different order than in the present disclosure, or some operations or steps may occur currently, or some operations may not be used, and/or some operations or steps may be repeated. Moreover, the actual operations or steps of process stages may require additional operations or steps before, during or after forming the semiconductor structure (for example, a semiconductor structure 100 in FIG. 15) to completely form the semiconductor structure 100. Therefore, the present disclosure may briefly illustrate some of these additional operations or steps. Further, unless otherwise stated, the same explanations discussed for the following figures, such as FIGS. 1 to 15, apply directly to the other figures.

Various embodiments of the present disclosure are described in detail below with FIGS. 1 to 15. In FIG. 1, a substrate 102 is provided. The substrate 102 is defined with an array area 110 and a peripheral area 120. More clearly, a surface of the substrate 102 in the array area 110 includes a barrier layer 104 including a first barrier layer 104A in the array area 110 and a second barrier layer 104P in the peripheral area 120. The substrate 102 in the array area 110 includes a plurality of active areas 140 and a plurality of insulation areas 130 between the active areas 140. Moreover, a source/drain region 142 is also formed in each of the active areas 140 and between the insulation areas 130.

Further, a plurality of trenches 106 are formed in the active areas 140 and the insulation areas 130. After forming the trenches 106, a dielectric material is deposited in the trenches 106 and on the surface of the substrate 102 in the array area 110 and the peripheral area 120 to form a first liner dielectric layer 152A and a second liner dielectric layer 152P, respectively. Further, a conductive layer 154 is deposited on the first liner dielectric layer 152A in the trenches 106 in the array area 110, as shown in FIG. 1. In some embodiments, the dielectric material may include an oxide, such as silicon oxide. In some embodiments, a middle dielectric layer 156 is deposited on the conductive layer 154 in the trenches 106 after forming the conductive layer 154 in each of the trenches 106.

In some embodiments, the substrate 102 may include silicon, such as crystalline silicon, polycrystalline silicon, or amorphous silicon. The substrate 102 may include an elemental semiconductor, such as germanium. In some embodiments, the substrate 102 may include alloy semiconductors, such as silicon germanium, silicon germanium carbide, gallium indium phosphide, or other suitable materials. In some embodiments, the substrate 102 may include compound semiconductors, such as silicon carbide (SiC), gallium arsenide (GaAs), indium phosphide (InP), indium arsenide (InAs), or other suitable materials. Moreover, in some embodiments, the 102 substrate can optionally have a semiconductor-on-insulator (SOI) structure.

Figure 2:
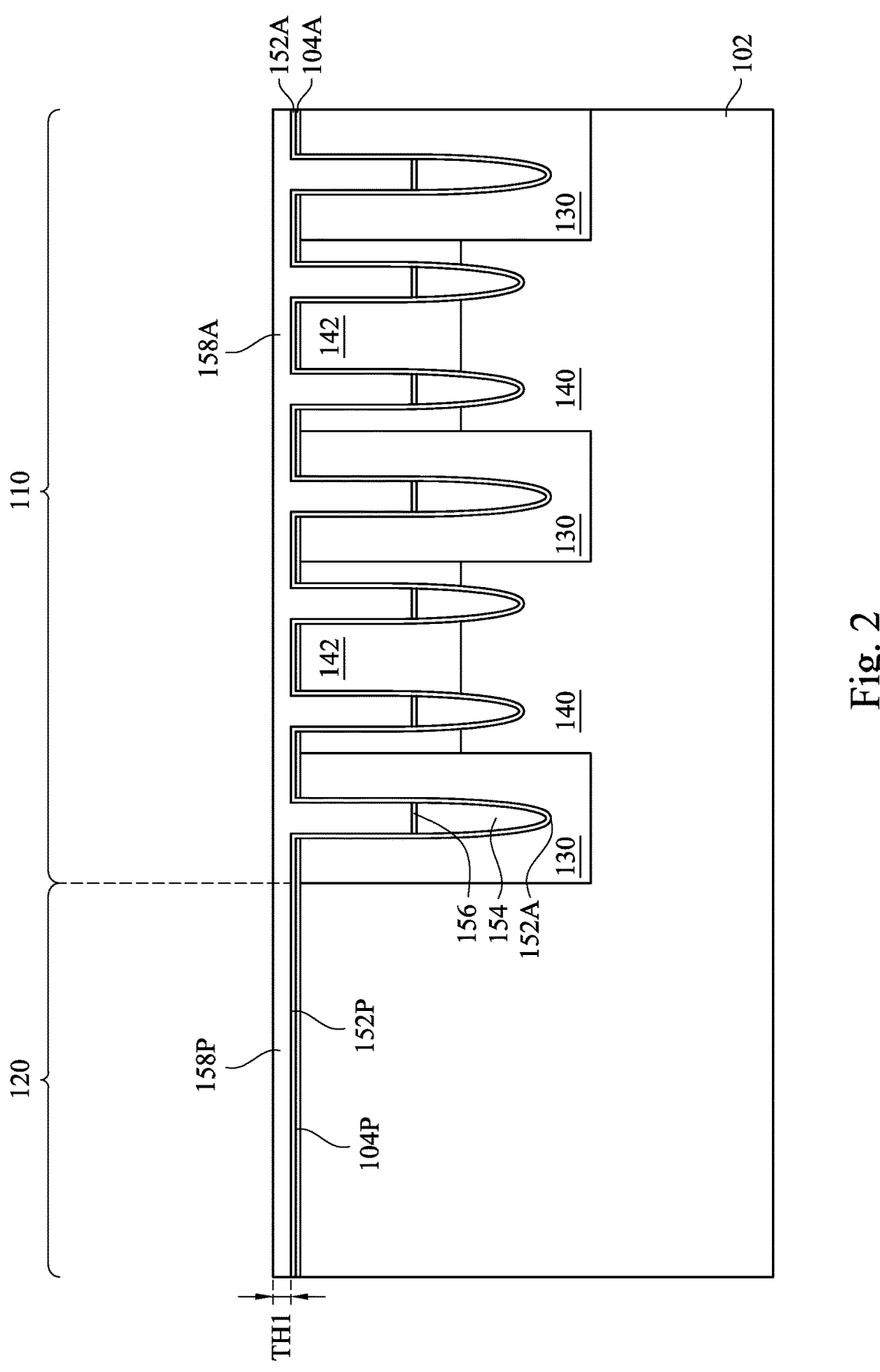

In FIG. 2, a cap layer 158 is deposited over the substrate 102. The cap layer 158 includes a first cap layer 158A deposited on the first liner dielectric layer 152A and on the conductive layer 154 in the trenches 106 in the array area 110, and a second cap layer 158P deposited on the second liner dielectric layer 152P in the peripheral area 120. In addition, the cap layer 158 has a first thickness TH1. In some embodiments, a material of the cap layer 158 may include silicon oxide, silicon nitride, silicon oxynitride or a combination thereof.

5

Figure 3:
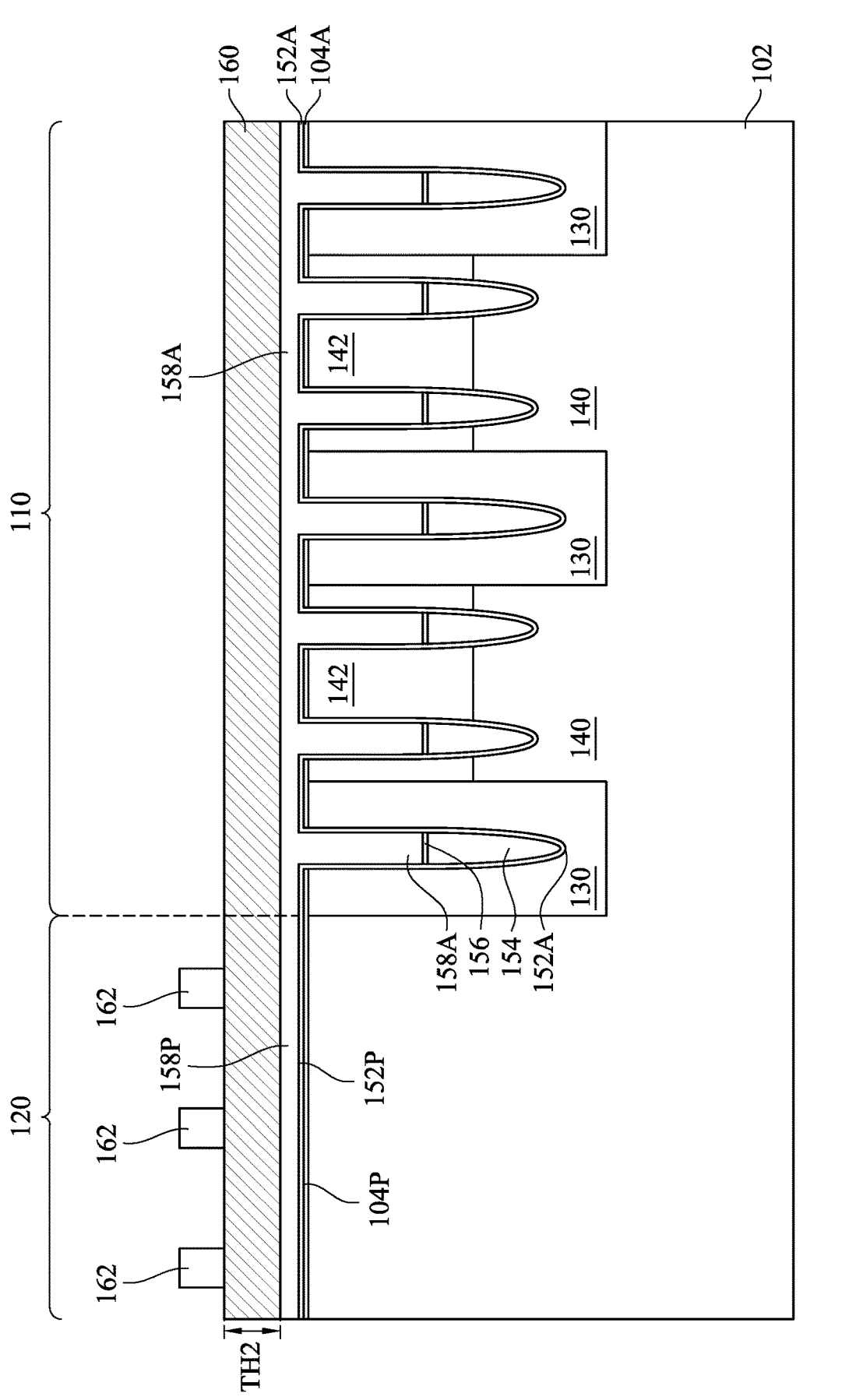

Next, in FIG. 3, a pad oxide layer 160 is formed on the cap layer 158 to a second thickness TH2. In some embodiments, a material of the pad oxide layer 160 is SiO₂. Then, a mask layer 162 is formed on the pad oxide layer 160 to expose first portions of the pad oxide layer 160 and cover second portions of the pad oxide layer 160. Moreover, the mask layer 162 is a photoresist mask layer.

Figure 4:
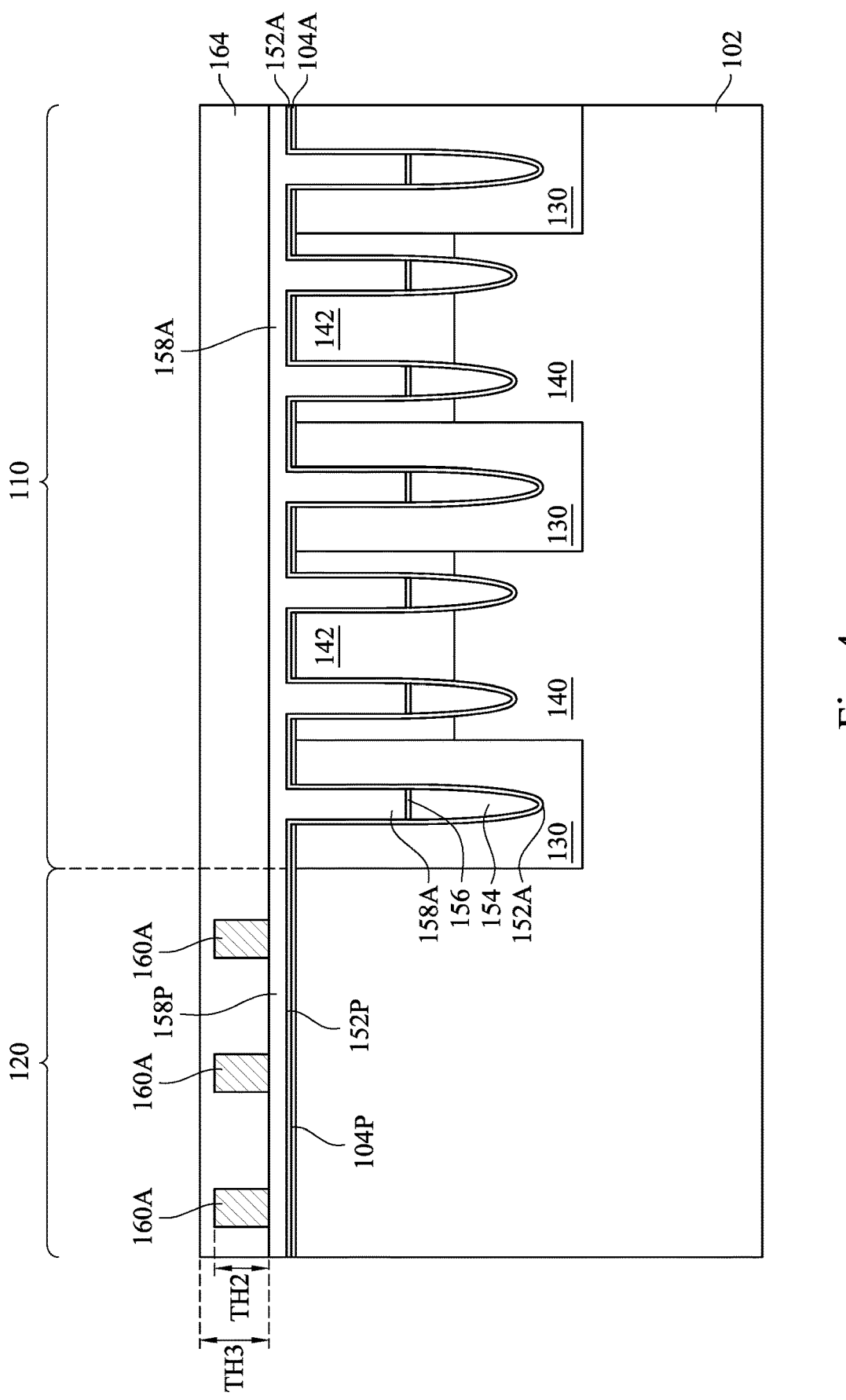

Further, in FIG. 4, a patterned pad oxide layer 160A on the second cap layer 158P in the peripheral area 120 is formed by a photolithography process, and a blocking layer 164 is formed on the first cap layer 158A and the second cap layer 158P. More specifically, the photolithography process is performed on the pad oxide layer 160 covered with the mask layer 162 after forming the mask layer 162. Next, the first portions of the pad oxide layer 160 are removed, and the second portions of the pad oxide layer 160 are remained. In other words, the patterned pad oxide layer 160A is formed on the second cap layer 158P in the peripheral area 120. Then, the blocking layer 164 is formed on the first cap layer 158A and the second cap layer 158P to a third thickness TH3, so as to completely cover the patterned pad oxide layer 160A. As shown in FIG. 4, the third thickness TH3 is greater than the second thickness TH2. In some embodiment, the mask layer is removed after the photolithography process. In some embodiments, a material of the blocking layer may include Si.

Figure 5:
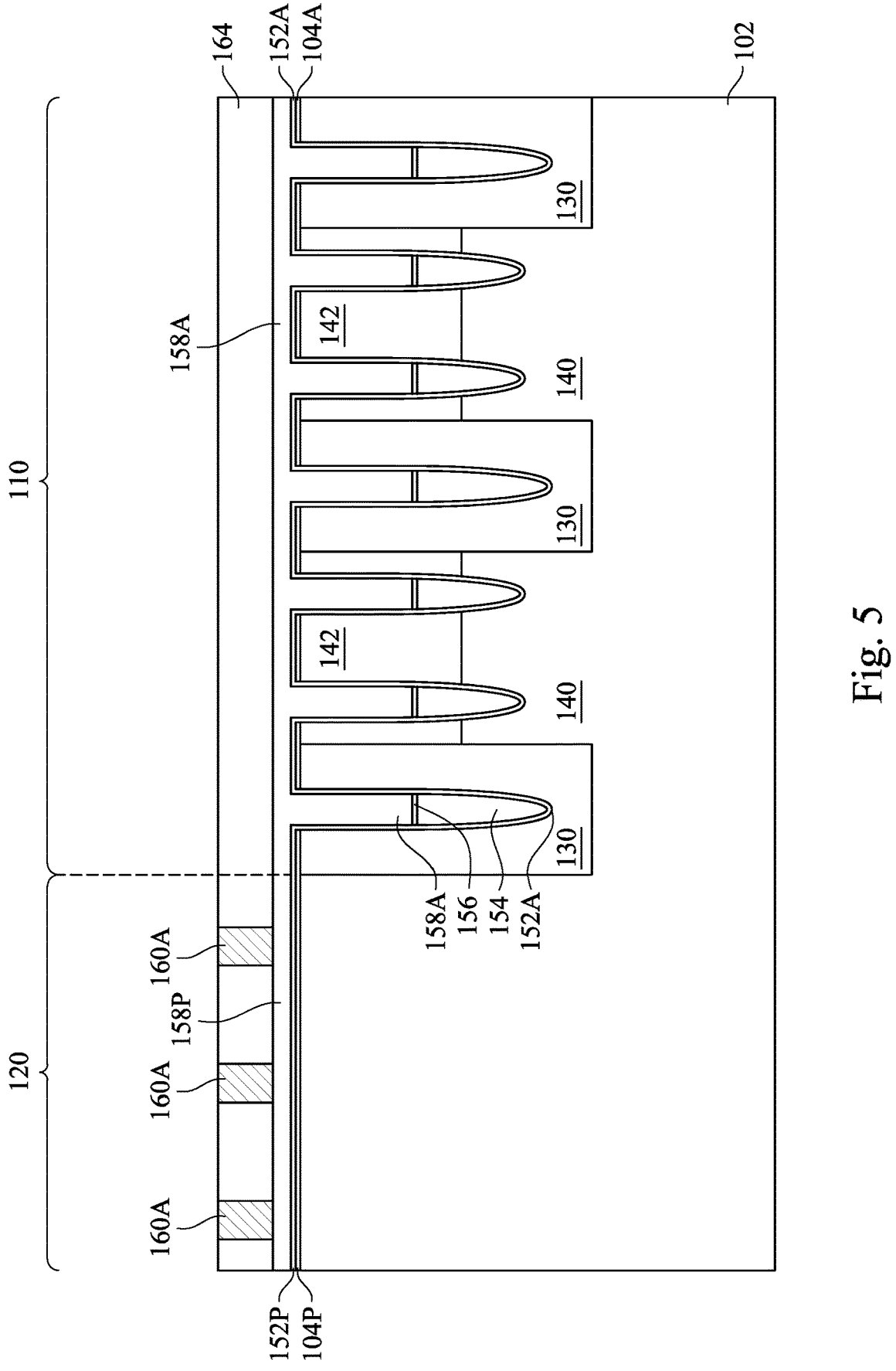

Further, in FIG. 5, a planarization process is performed to make a top surface of the blocking layer 164 and a top surface of the patterned pad oxide layer 160A coplanar. In some embodiments, the thickness of the blocking layer and the patterned pad oxide layer 160A is the second thickness TH2 or less than the second thickness TH2 after the planarization process. In some embodiments, the planarization process is an etching back process.

Figure 6:
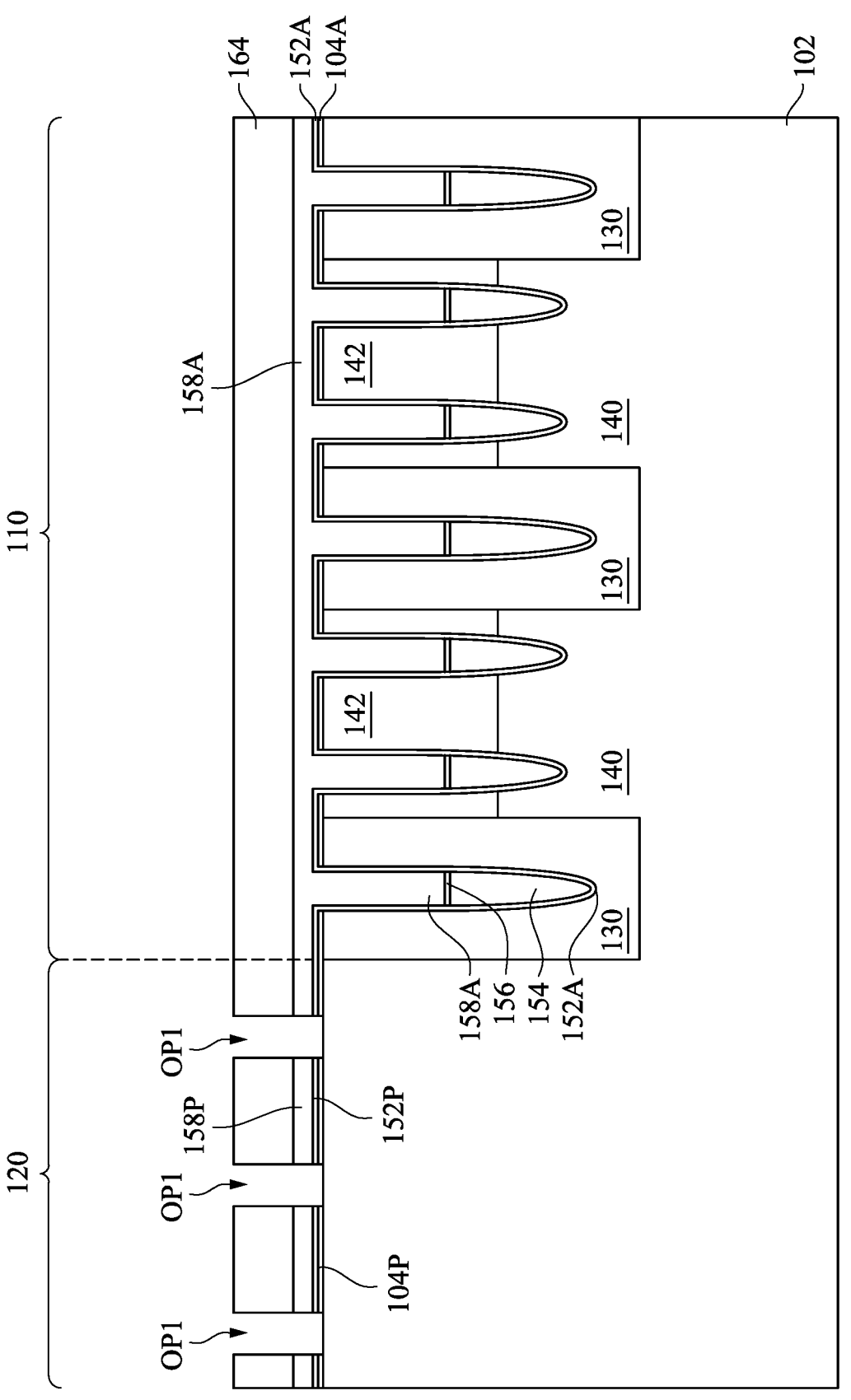

Subsequently, please refer to FIG. 6. A plurality of first openings OP1 are formed in the blocking layer 164, the second cap layer 158P, the second liner dielectric layer 152P and the second barrier layer 104P in the peripheral area 120 by an etching process. In some embodiments, the etching process may a wet etching process or a dry etching process. Although the number of the first openings OP1 is three in FIG. 6, this disclosure is not limited thereto.

Figure 7:
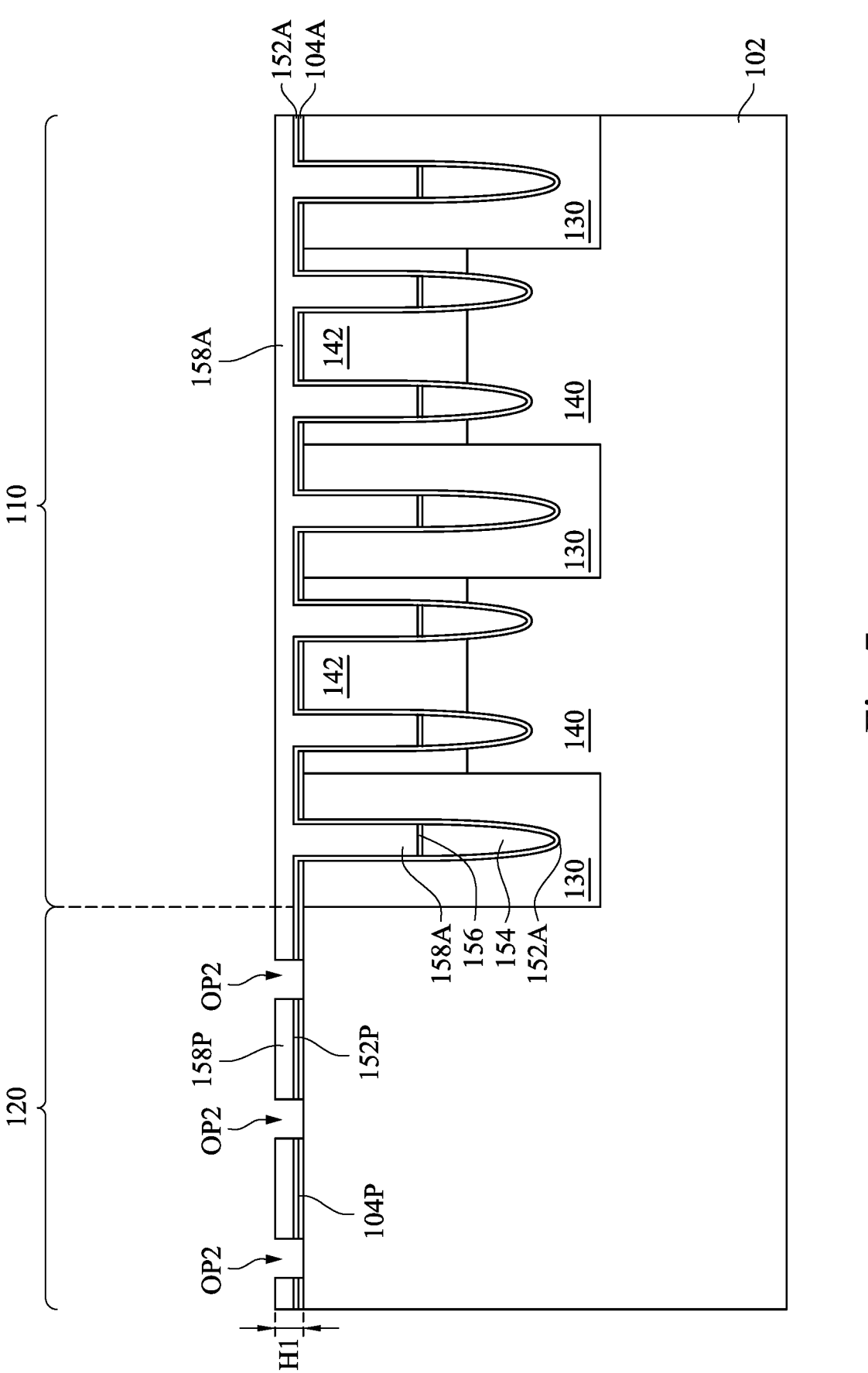

In FIG. 7, the remained blocking layer 164 is removed to form a plurality of second openings OP2 at the same positions of the first openings OP1 on the substrate 102 in the peripheral area 120. Moreover, each of the second openings OP2 has a first height H1 measured from the top surface of the substrate 102 to a top surface of the second cap layer 158P. In some embodiments, the remained blocking layer 164 is removed by a photoresist striping process. Although the number of the second openings OP2 is three in FIG. 7, this disclosure is not limited thereto.

Figure 8:
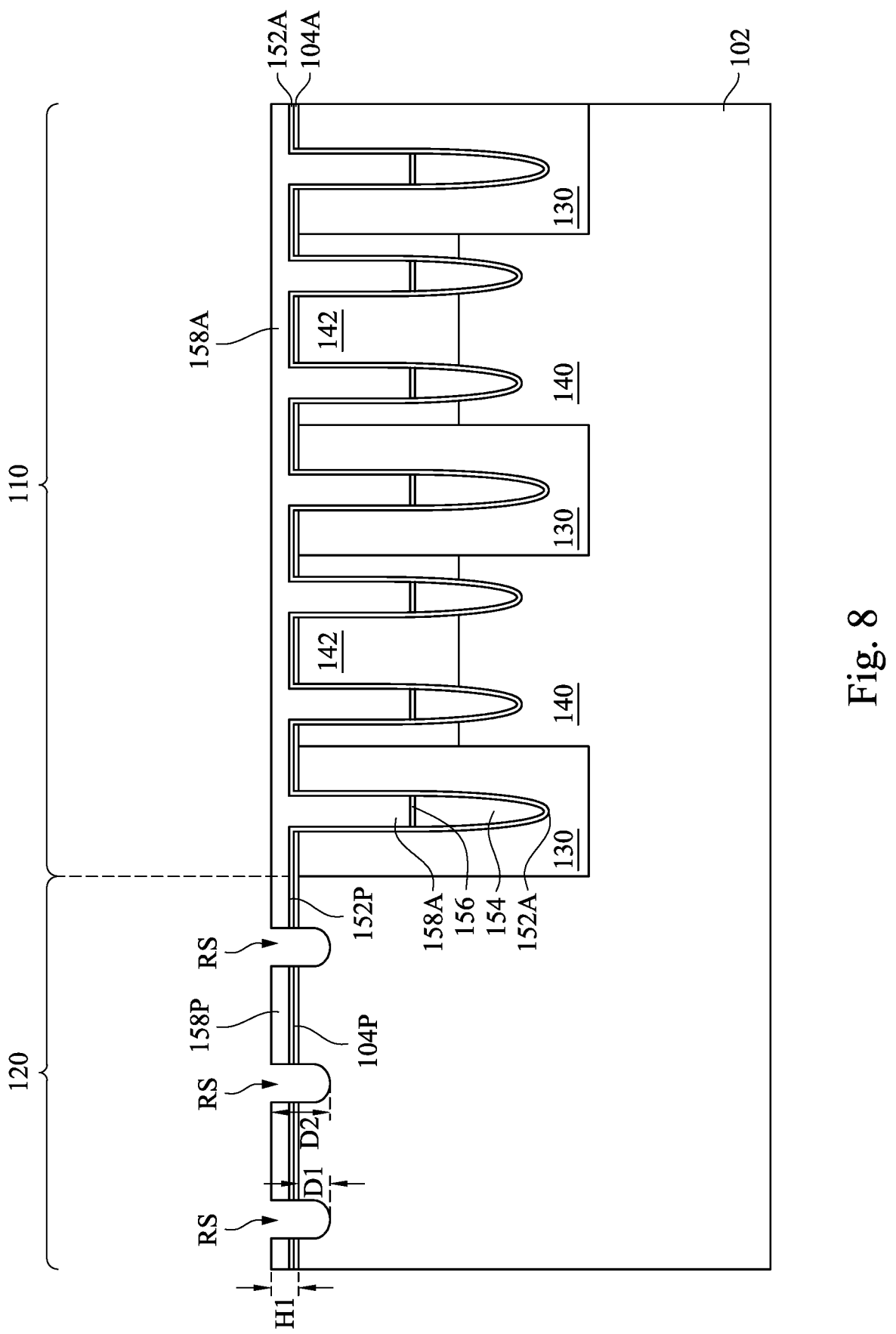

Further, in FIG. 8, the plurality of recesses RS are formed at the position of each of the second openings OP2 in the substrate 102 in the peripheral area 120. Moreover, the recesses RS in the peripheral area 120 has a first depth D1 measured from a bottom of each of the recesses RS to the top surface of the substrate 102. In some embodiments, a total depth of each of the recesses RS is a second depth D2, and the second depth D2 is the first height H1 plus the first depth D1. In some embodiments, the first cap layer 158A is served as a protection mask for the active areas and the insulation areas in the array area. In some embodiments, a protection mask (not shown) is formed on the first cap layer 158A in the array area 110 after forming the second openings OP2 or forming the recesses RS. In addition, a bottom surface of each of the recesses RS is curved or tapered. Although the number of the recesses RS is three in FIG. 8, this disclosure is not limited thereto.

Figure 9:
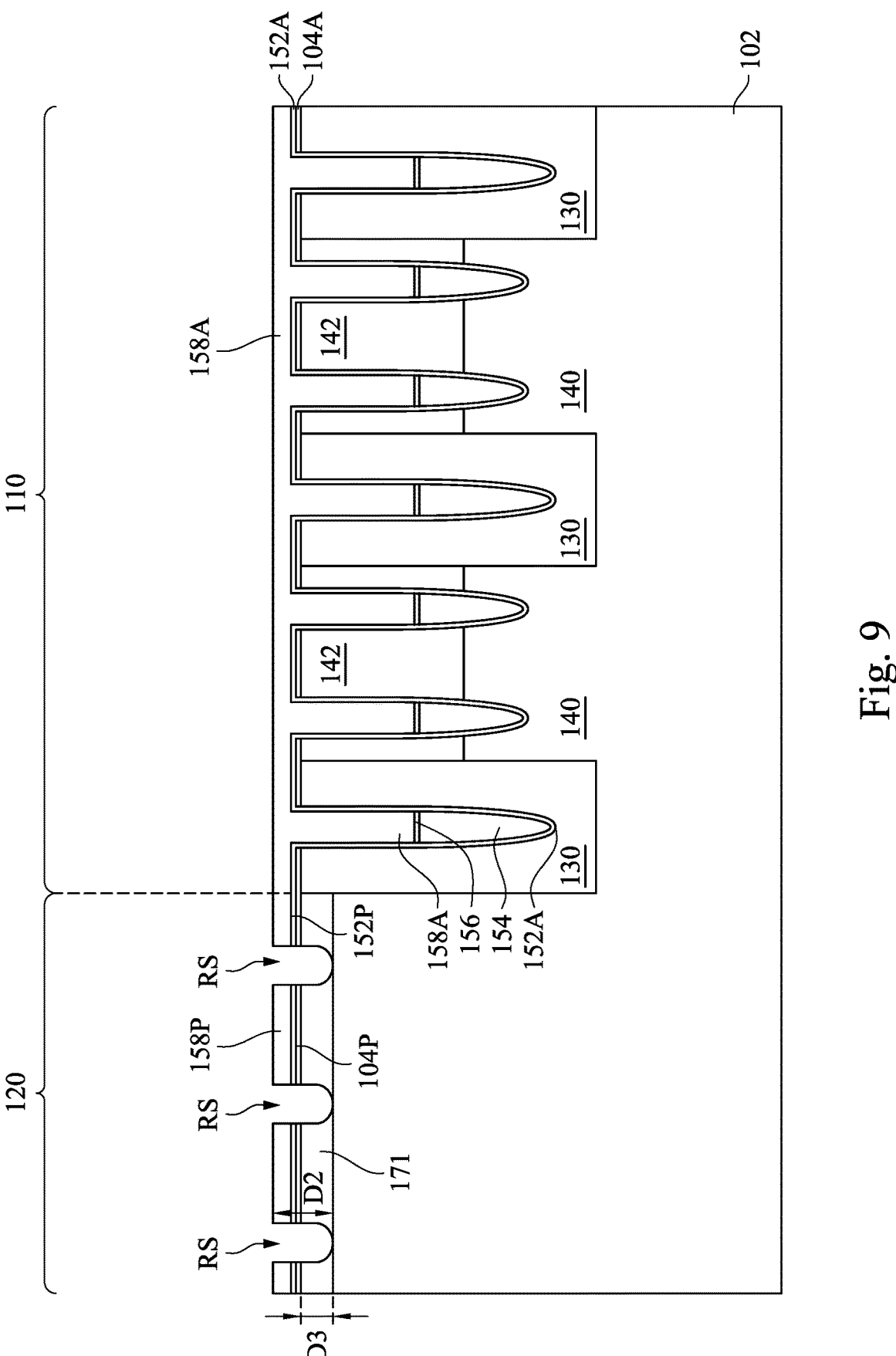

Next, in FIG. 9, a plurality of light doped drain (LDD) regions 171 are formed on opposite sides of each of the recesses RS in the substrate 102 in the peripheral area 120 by using an iron implantation mask (not shown) after forming the recesses RS. In some embodiments, the light doped drain (LDD) regions 171 are doped through a self-aligned implantation based on the positions of the recesses RS. In some embodiments, each of the LDD regions 171 has a third depth D3 in the substrate 102. In some embodiments, the third depth D3 and the second depth D2 are at the same level. In some embodiments, the second depth D2 is deeper than the third depth D3.

Figure 10:
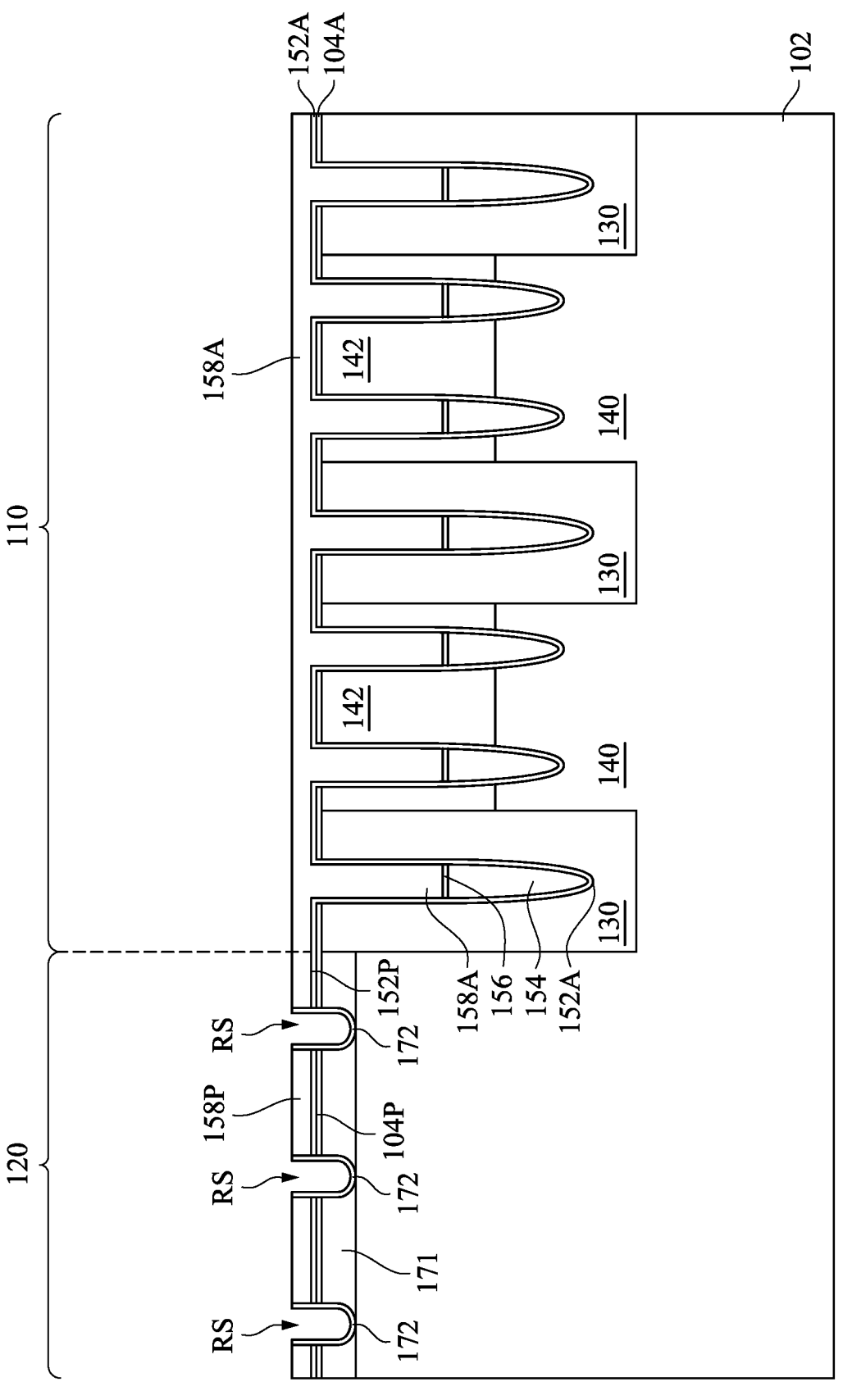

Subsequently, please refer to FIG. 10. A gate dielectric layer 172 is formed on an inner surface of each of the recesses RS in the peripheral area 120. In some embodiments, the gate dielectric layer 172 is conformally deposited on the inner surface of each of the recesses RS. In some embodiments, a material of the gate dielectric layer 172 is an oxide.

Figure 11:
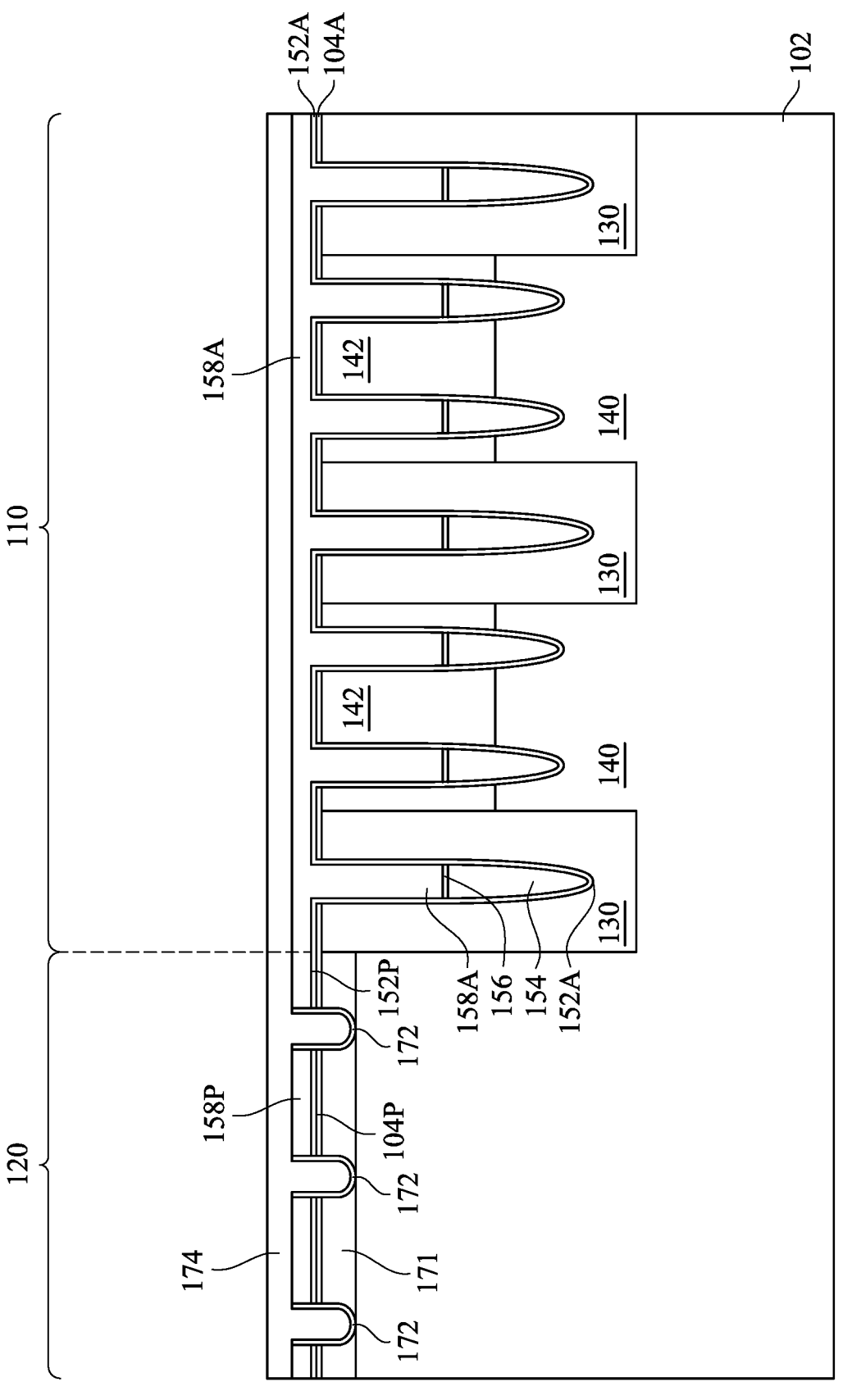

In FIG. 11, a first gate conductive layer 174 is formed on the gate dielectric layer 172 in the each of the recesses RS in the peripheral area 120. In some embodiments, a material of the first gate conductive layer 174 may include polysilicon or doped polysilicon.

Figure 12:
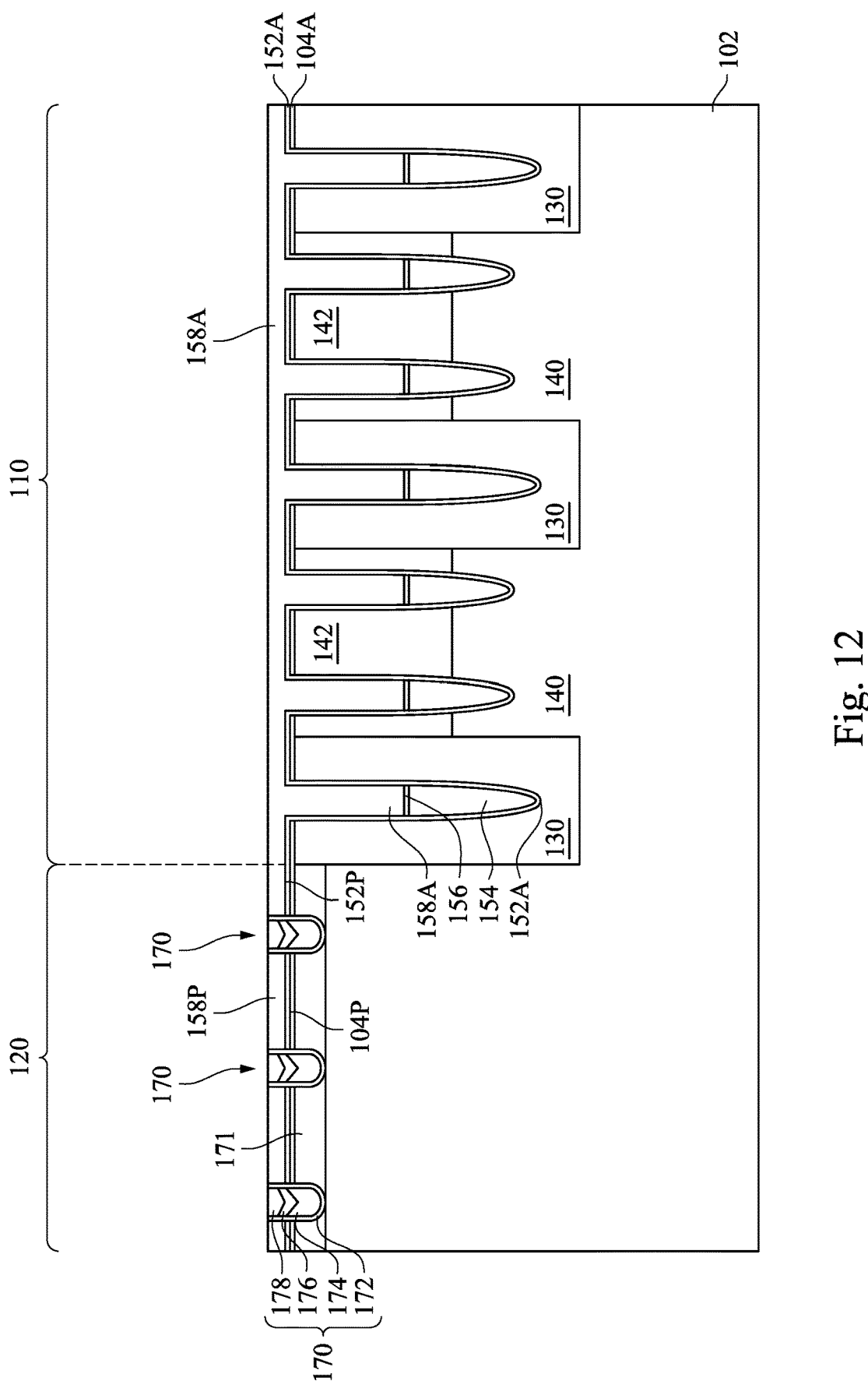

Further, in FIG. 12, the gate structures 170 are formed in the substrate 102 in the peripheral area 120. Specifically, the first gate conductive layer 174 is etched an expected depth by an isotropic etching process. In this way, a top portion of the first gate conductive layer 174 is concave and a bottom surface of the first gate conductive layer 174 is curved or tapered after etching. Moreover, the first gate conductive layer 174 is disposed between the LDD regions 171. In some embodiments, the expected depth of the first gate conductive layer 174 may be related to the third depth D3 of each of the LDD regions 171.

Next, a second gate conductive layer 176 is deposited on the first gate conductive layer 174 followed by a top shape of the first gate conductive layer 174. Also, the second gate conductive layer 176 is etched by an isotropic etching process. Thus, a top portion of the second gate conductive layer 176 is concave and a bottom surface of the second gate conductive layer 176 is curved or tapered. In some embodiments, in cross-section diagram (such as FIG. 12), the bottom portion of the second gate conductive layer 176 is U-shaped or V-shaped. In some embodiments, a material of the second gate conductive layer 176 may be is a metal-containing material, including siliconized metal, such as WSi₂, metal or a combination thereof.

Further, a cap insulating layer 178 is formed on the second gate conductive layer 176 in each of the recesses RS. Similarly, the cap insulating layer 178 is deposited on the second gate conductive layer 176 followed by a top shape of the second gate conductive layer 176. Thus, a bottom surface of the cap insulating layer 178 is curved or tapered. In some embodiments, in cross-section diagram (such as FIG. 12), the bottom portion of the cap insulating layer 178 is U-shaped or V-shaped. In some embodiments, a material of the cap insulating layer 178 is a nitro-containing material, such as silicon nitride. In addition, a planarization process is performed to make a top surface of the cap insulating layer 178 and the top surface of the second cap layer 158P coplanar. As well, the gate structures 170 are formed in the peripheral area 120 after the planarization process. In some embodiments, the planarization process may an etching process or a chemical mechanical planarization (CMP) process. Although the number of the gate structures 170 is 3 in FIG. 12, this disclosure is not limited thereto.

Figure 13:
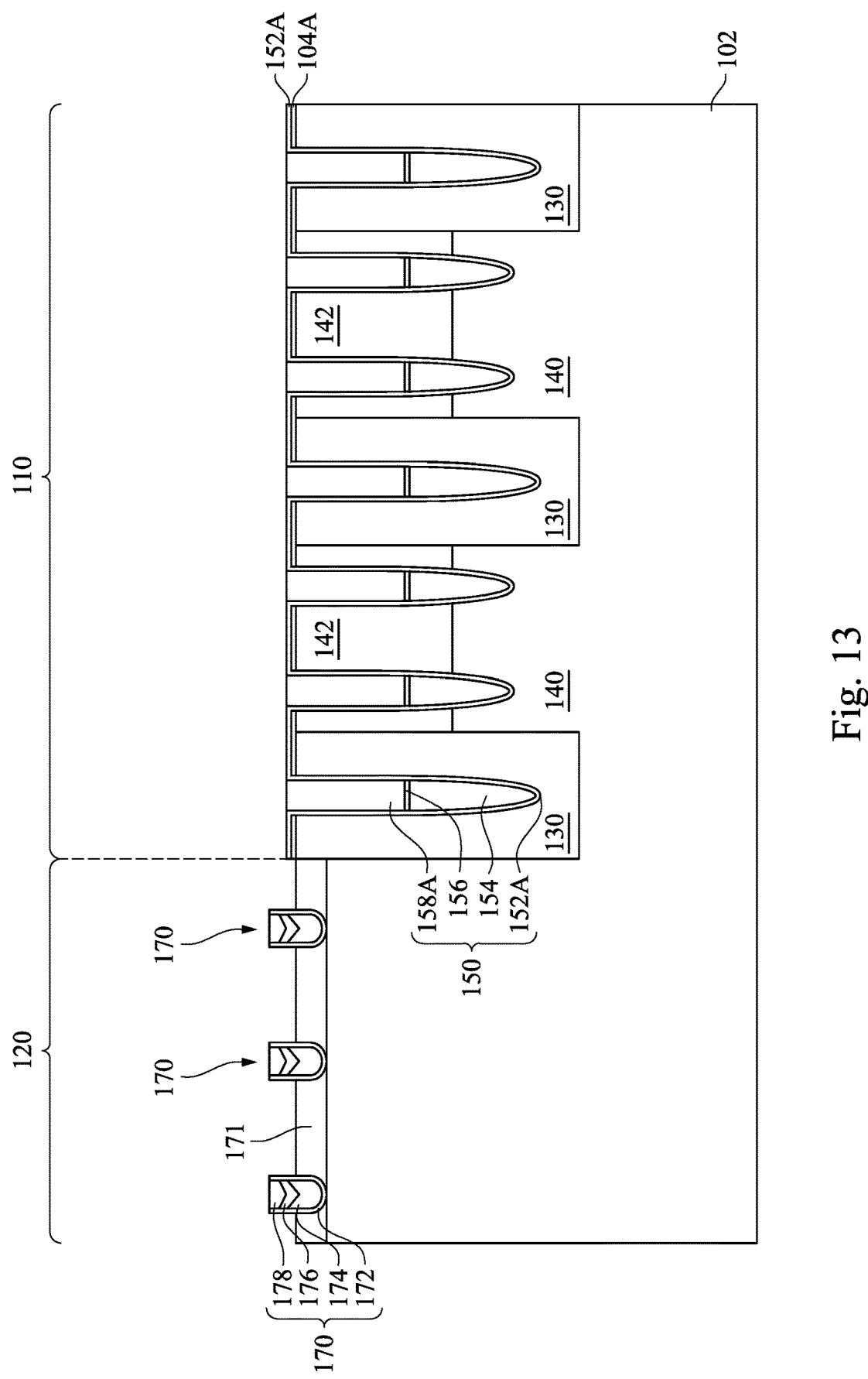

Next, in FIG. 13, the cap layer 158 including the first cap layer 158A in the array area 110 and the second cap layer 158P in the peripheral area 120 is removed by an etching process. Moreover, the second liner dielectric layer 152P and the second barrier layer 104P are also removed by the etching process. It is worth to mention that a top portion of each of the gate structures 170 is exposed after the etching process. Also, the word line structures 150 in the array area 110 are formed after the etching process.

Figure 14:
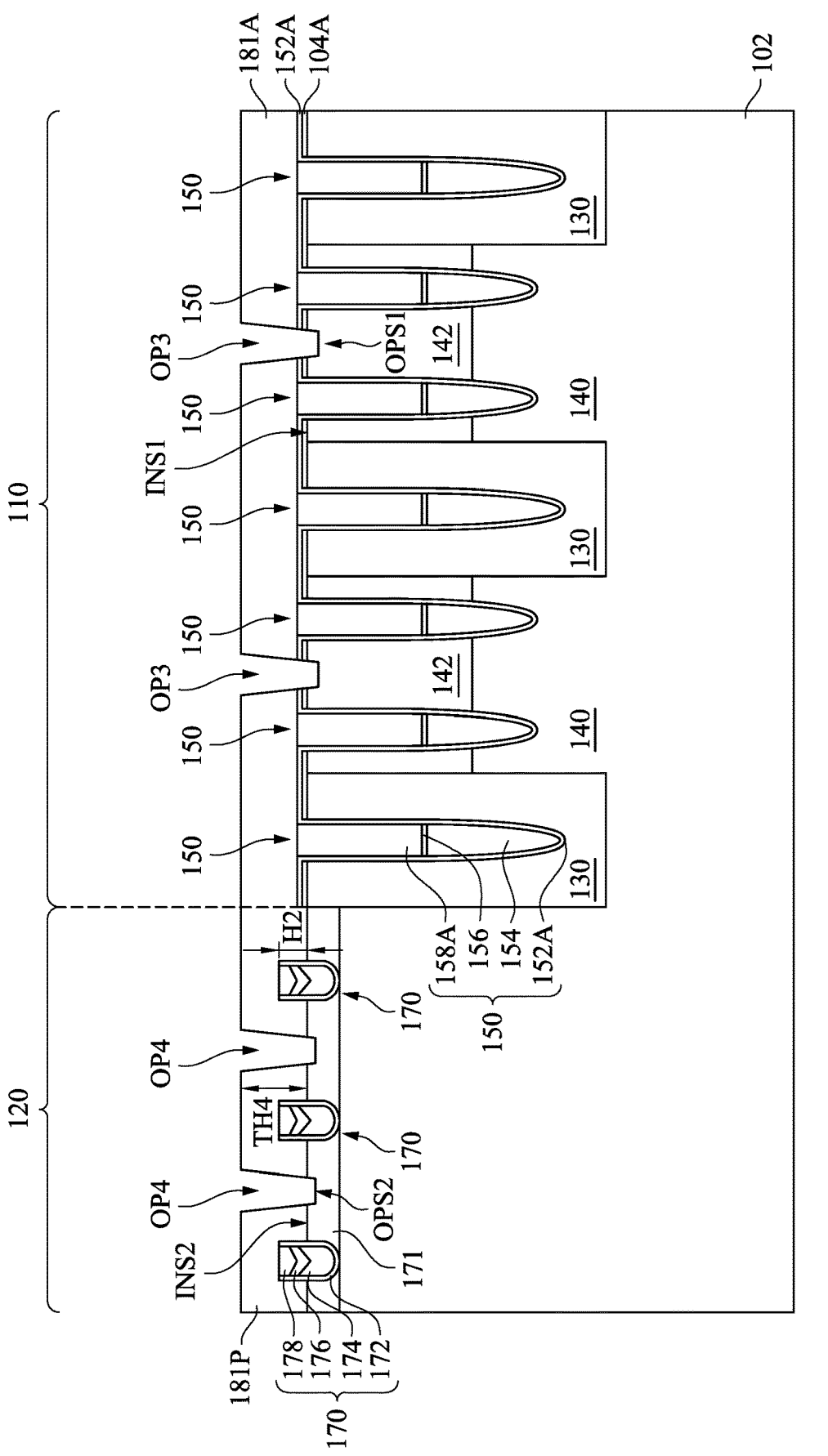

Then, in FIG. 14, a dielectric material is deposited on the first liner dielectric layer 152A in the array area 110 and on the surface of the substrate 102 in the peripheral area 120 to form a first dielectric layer 181A and a second dielectric layer 181P covering the gate structures 170, respectively. In some embodiments, the dielectric material may be silicon oxide. In some embodiments, the dielectric material is deposited by a chemical vapor deposition (CVD), a low pressure chemical vapor deposition (LPCVD), a plasma enhanced chemical vapor deposition (PECVD) or a high density plasma CVD (HDP-CVD). In some embodiments, the second dielectric layer 181P has a fourth thickness TH4 measured from a second interface INS2 between the substrate 102 and the second dielectric layer 181P to a top surface of the second dielectric layer 181P. Moreover, the fourth thickness TH4 is greater than the second height H2 measured from the second interface INS2 of the substrate 102 (especially, each of the LDD regions 171) and the second dielectric layer 181P to the top surface of the cap insulating layer 178 of each of the gate structures 170. In some embodiments, a portion of an outer surface of the upper portion of each of the gate structures 170 contacts each of the LDD regions 171. In some embodiments, an outer surface of the upper portion of each of the gate structures 170 contacts each of the LDD regions 171.

Subsequently, in the array area 110, a plurality of third openings (also called contact openings) OP3 are formed between the word line structures 150 at the same active area 140 in the first dielectric layer 181A by passing through the first dielectric layer 181A, the first liner dielectric layer 152A and the first barrier layer 104A until the source/drain region 142. In some embodiments, a first interface INS1 between the first barrier layer 104A and the S/D region 142 is higher than a first bottom surface OPS1 of the third openings OP3.

Also, a plurality of fourth openings (also called contact openings) OP4 are formed between the gate structures 170 in the second dielectric layer 181P by passing through the second dielectric layer 181P until each of the light doped drain regions 171. In some embodiments, the second interface INS2 between the substrate 102 and the second dielectric layer 181P is higher than a second bottom surface OPS2 of the fourth openings OP4.

Figure 15:
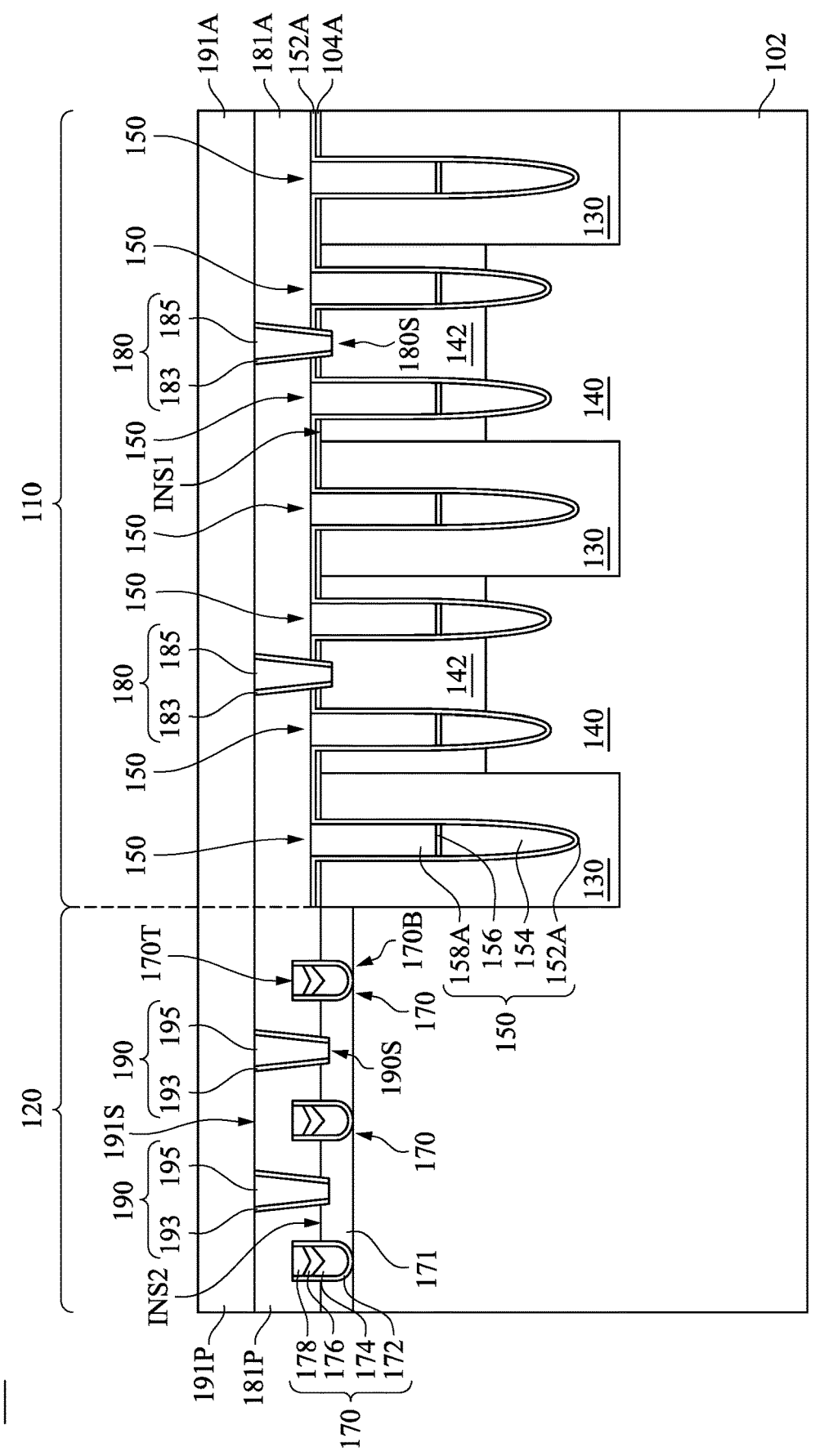

Further, in FIG. 15, a first contact plug 180 is formed in array area 110, and a second contact plug 190 is formed in the peripheral area 120. Specifically, a barrier metal material is deposited on inner sidewalls of the third opening OP3 and the fourth openings OP4 by a deposition process to form a first barrier metal layer 183 and the second barrier metal layer 193, respectively. In some embodiments, the barrier metal material includes titanium (Ti), titanium nitride (TiN), titanium tungsten (TiW), titanium/titanium nitride (Ti/TiN), cobalt (Co), nickel (Ni), hafnium (Hf), platinum (Pt), tungsten (W), titanium Tungsten (TiW), titanium/titanium nitride, tantalum (Ta) and tantalum nitride (TaN). In some embodiments, the deposition process is an atomic layer deposition (ALD), a CVD, a physical vapor deposition (PVD) process.

Next, a conductive metal material is deposited to fill the third openings OP3 110 with the first barrier metal layer 183 and the fourth openings OP4 with the second barrier metal layer 193 to form a first conductive metal layer 185 and a second conductive metal layer 195, respectively. In some embodiments, the conductive metal material is tungsten (W). In some embodiments, a deposition process of the conductive metal material is an ALD, a CVD, a physical vapor deposition (PVD) process. Although the number of the first contact plugs 180 is 2 and the number of the second contact plugs 190 is 2 in FIG. 15, this disclosure is not limited thereto.

Furthermore, an insulating material is deposited on the first dielectric layer 181A and the second dielectric layer 181P to form a first interlayer dielectric (ILD) layer 191A and a second ILD layer 191P, respectively. In some embodiments, the insulating material is an oxide, a nitride or a combination thereof.

Through the method of manufacturing the semiconductor structure 100, each of the recessed gate structures 170 can solve the leakage problem caused by shrinking semiconductor devices in the prior art leading to the distance between gate channels to become smaller. In addition, operations of the manufacturing method are not very complicated. Thus, the leakage problem can be improved without increasing production costs.

A semiconductor structure is also provided by embodiments of this disclosure, as shown in FIG. 15. In FIG. 15, a semiconductor structure 100 includes a substrate 102, a plurality of word line structures 150, a first dielectric layer 181A, a second dielectric layer 181P and a plurality of gate structures 170.

The substrate 102 is defined with an array area 110 and a peripheral area 120. The substrate 102 in the array area 110 includes a plurality of active areas 140 and a plurality of insulation areas 130 between the active areas. As well, the semiconductor structure 100 also includes a source/drain (S/D) region 142 disposed in each of the active areas 140 and between the insulation areas 130.

The word line structures 150 are disposed in the active areas 140 and the insulation areas 130. Further, each of the word line structures 150 includes a conductive layer 154, a first cap layer 158A on the conductive layer 154 and a first liner dielectric layer 152A surrounding the conductive layer 154 and the first cap layer 158A. In some embodiments, each of the word line structures also includes a middle dielectric layer 156 between the conductive layer 154 and the first cap layer 158A. In some embodiments, the depth of each of the word line structures 150 in the insulation areas 130 is greater than the depth of each of the word line structures 150 in the active areas 140. Moreover, the S/D region 142 is disposed on opposite sides of each of the word line structures 150.

The first dielectric layer 181A is disposed on the word line structures 150 in the array area 110. The second dielectric layer 181P is disposed on the substrate 102 in the peripheral area 120. In some embodiments, a top surface of the first cap layer 158A of each of word line structures 150 and a top surface of the first liner dielectric layer 152A on the first barrier layer 104A are coplanar.

Further, each of the gate structures 170 includes a bottom portion and an upper portion. The bottom portion of each of the gate structures 170 is disposed in the substrate 102 in the peripheral area 120, and the upper portion of each of the gate structures 170 is disposed in the second dielectric layer 181P in the peripheral area 120. Specifically, each of the gate structures 170 includes a first gate conductive layer 174, a second gate conductive layer 176 disposed on the first gate conductive layer 174, a cap insulating layer 178 disposed on the second gate conductive layer 176, and a gate dielectric layer 172 disposed surrounding the first gate conductive layer 174, the second gate conductive layer 176 and the cap insulating layer 178. It is worth to mention that a top portion of the first gate conductive layer 174 is concave, a top portion of the second gate conductive layer 176 is concave, a bottom portion of the second gate conductive layer 176 is curved or tapered, and a bottom portion of the cap insulating layer 178 is curved or tapered. In addition, in cross-section diagram (such as FIG. 16), the bottom portions of the second gate conductive layer 176 and the cap insulating layer 178 are U-shaped or V-shaped.

Further, the semiconductor structure 100 includes a plurality of light doped drain (LDD) regions 171. The LDD region 171 is disposed on opposite sides of each of the gate structures 170 in the substrate 102.

In some embodiments, the semiconductor structure 100 includes a first contact plug 180 in the array area 110 and a second contact plug 190 in the peripheral area 120. Specifically, the first contact plug 180 is disposed between the word line structures 150 in the first dielectric layer 181A, and the first contact plug 180 contacts the S/D region 142. As well, the second contact plug 190 is disposed the gate structures 170 in the second dielectric layer 181P, and the second contact plug 190 contacts the LDD region 171. In some embodiments, the first contact plug 180 includes a first conductive metal layer 185 and a first barrier metal layer 183 surrounding a sidewall of the first conductive metal layer 185. In some embodiments, the second contact plug 190 includes a second conductive metal layer 195 and a second barrier metal layer 193 surrounding a sidewall of the second conductive metal layer 195.

In some embodiments, a first interface INS1 between the first barrier layer 104A and the S/D region 142 is higher than a first contact interface 180S between the first contact plug 180 and the S/D region 142. In some embodiments, a second interface INS2 between the substrate 102 and the second dielectric layer 181P is higher than a second contact surface 190S of the second contact plug 190. In some embodiments, the second contact surface 190S of the second contact plug 190 is higher than a bottom surface 170B of each of the gate structures 170.

In some embodiments, the semiconductor structure 100 includes an interlayer dielectric layer 191. The interlayer dielectric layer 191 is disposed on the first dielectric layer 181A and the second dielectric layer 181P. In some embodiments, a third interface between the second dielectric layer 181P and the interlayer dielectric layer 191 is higher than a top surface 170T of each of the gate structures 170. In some embodiments, a top surface of the first contact plug 180 contacts a bottom surface of the interlayer dielectric layer 191. In some embodiments, a top surface of the second contact plug 190 contacts the bottom surface of the interlayer dielectric layer 191.

The semiconductor structure 100 with the recessed gate structures 170 provided by the embodiments of the present disclosure can solve the leakage problem caused by shrinking semiconductor devices in the prior art leading to the distance between gate channels to become smaller. Therefore, even if the semiconductor devices continue to shrink leading to channels in the semiconductor devices shorter, the leakage can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor structure, comprising:

providing a substrate, wherein a surface of the substrate is defined with an array area and a peripheral area, and the substrate comprises a first barrier layer in the array area and a second barrier layer in the peripheral area;

etching toward the substrate to form a plurality of recesses in the peripheral area to make a bottom surface of each of the plurality of recesses lower than a bottom surface of the second barrier layer;

depositing a gate dielectric layer on an inner surface of each of the plurality of recesses;

depositing a first gate conductive layer on the gate dielectric layer;

etching the first gate conductive layer;

forming a second gate conductive layer on the first gate conductive layer; and depositing a cap insulating layer on the gate second conductive layer to form a plurality of gate structures.

2. The method of claim 1, wherein forming the plurality of recesses to in the peripheral area comprises:

forming a cap layer over the substrate;

forming a pad oxide layer to a second thickness on the cap layer;

forming a mask layer on the pad oxide layer to expose first portions of the pad oxide layer and cover second portions of the pad oxide layer;

performing a photolithography process;

removing the second portions of the pad oxide layer, and portions of the cap layer and portions of the second barrier layer covered by the second portions of the pad oxide layer to form a plurality of first openings; and etching the substrate in the peripheral area to a first depth at a same position of each of the plurality of first openings to form the plurality of recesses.

3. The method of claim 2, wherein forming the plurality of recesses to in the peripheral area comprises:

removing the first portions of the pad oxide layer after performing the photolithography process; and forming a blocking layer on the cap layer to a third thickness to completely cover the second portions of the pad oxide layer.

4. The method of claim 3, wherein the third thickness is greater than the second thickness.

5. The method of claim 3, wherein forming the plurality of recesses to in the peripheral area comprises:

removing the blocking layer to form a plurality of second openings at a same position of the plurality of first openings after forming the plurality of first openings, wherein each of the plurality of second openings has a first height; and etching the substrate in the peripheral area to a first depth at a same position of each of the plurality of second openings to form the plurality of recesses.

6. The method of claim 2, further comprising:

forming a plurality of light doped drain regions on opposite sides of each of the plurality of recesses in the substrate by doped through a self-aligned implantation based on positions of the recesses.

7. The method of claim 6, further comprising:

forming a plurality of contact plugs between the plurality of gate structures in a dielectric layer in the peripheral area to contact each of the plurality of light doped drain regions.

8. The method of claim 7, wherein forming the plurality of contact plugs in peripheral area comprises:

removing the cap layer and the second barrier layer to expose an upper portion of each of the plurality of gate structures and portions of the substrate in the peripheral area after forming the plurality of gate structures;

depositing the dielectric layer on the substrate in the peripheral area to completely cover the plurality of gate structures;

forming a plurality of contact openings between the plurality of gate structures in the dielectric layer by passing through the dielectric layer until each of the plurality of light doped drain regions; and forming the plurality of contact plugs in the plurality of contact openings, respectively.

9. The method of claim 8, wherein an interface between the substrate and the dielectric layer in the peripheral area is higher than a bottom surface of each of plurality of contact openings.

10. The method of claim 8, wherein a bottom surface of each of the plurality of gate structures is lower than an interface between the substrate and the dielectric layer in the peripheral area.

11. A semiconductor structure, comprising:

a substrate, defined with an array area and a peripheral area, wherein a surface of the substrate in the array area comprises a first barrier layer, and the surface of the substrate in the peripheral area comprises a second barrier layer, wherein the substrate in the array area comprises a plurality of active areas and a plurality of insulation areas between the active areas, and a source/drain region is disposed in each of the plurality of active areas and between the plurality of insulation areas;

a plurality of word line structures, disposed in the plurality of active areas and the plurality of insulation areas;

a first dielectric layer, disposed on the plurality of word line structures in the array area;

a second dielectric layer, disposed on the substrate in the peripheral area; and a plurality of gate structures, comprising a bottom portion and an upper portion, wherein the bottom portion is disposed in the substrate in the peripheral area, and the upper portion is disposed in the second dielectric layer in the peripheral area, and wherein each of the plurality of gate structures comprises:

a first gate conductive layer;

a second gate conductive layer, disposed on the first gate conductive layer;

a cap insulating layer, disposed on the second gate conductive layer; and a gate dielectric layer, disposed surrounding the first gate conductive layer, the second gate conductive layer and the cap insulating layer, wherein a bottom surface of each of the gate structures is curved or tapered.

12. The semiconductor structure of claim 11, wherein a top surface of the first gate conductive layer is concave.

13. The semiconductor structure of claim 11, wherein a bottom surface of the second gate conductive layer is curved or tapered.

14. The semiconductor structure of claim 11, further comprising:

a first contact plug, disposed between the plurality of word line structures in the first dielectric layer, wherein the first contact plug contacts the source/drain region.

15. The semiconductor structure of claim 14, wherein a first interface between the first barrier layer and the source/drain region is higher that a first contact interface between the first contact plug and the source/drain region.

16. The semiconductor structure of claim 11, further comprising:

a plurality of light doped drain regions, disposed on opposite sides of each of the plurality of gate structures in the substrate.

17. The semiconductor structure of claim 16, wherein a portion of an outer surface of the upper portion of each of the plurality of gate structures contacts each of the plurality of light doped drain regions.

18. The semiconductor structure of claim 16, wherein an outer surface of the upper portion of each of the plurality of gate structures contacts each of the plurality of light doped drain regions.

19. The semiconductor structure of claim 16, further comprising:

a second contact plug, disposed between the plurality of gate structures in the second dielectric layer, wherein the second contact plug contacts each of the plurality of light doped drain regions.

20. The semiconductor structure of claim 19, wherein a second contact surface of the second contact plug is higher than a bottom surface of each of the gate structures.

* * * * *